(12) United States Patent
Wajda et al.

(10) Patent No.: US 6,500,761 B1
(45) Date of Patent: Dec. 31, 2002

(54) METHOD FOR IMPROVING THE ADHESION AND DURABILITY OF CVD TANTALUM AND TANTALUM NITRIDE MODULATED FILMS BY PLASMA TREATMENT

(75) Inventors: Cory Wajda, Mesa, AZ (US); Joseph T. Hillman, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/000,548

(22) Filed: Oct. 24, 2001

(51) Int. Cl.[7] ...................... H01L 21/44; H01L 21/8238
(52) U.S. Cl. ........................................ 438/685; 438/680
(58) Field of Search ................................. 438/680, 685, 438/627

(56) References Cited

U.S. PATENT DOCUMENTS 5,989,999 A    11/1999   Levine et al. ................ 438/627
6,146,993 A  *  11/2000   Brown et al. ................ 438/627

* cited by examiner

*Primary Examiner*—Richard Elms
*Assistant Examiner*—Beth E. Owens
(74) *Attorney, Agent, or Firm*—Wood, Herron & Evans, LLP

(57) ABSTRACT

A method for forming modulated tantalum/tantalum nitride diffusion barrier stacks on semiconductor device substrates used in interconnect structures. Alternating layers of tantalum and tantalum nitride are deposited onto the semiconductor device substrate by chemical vapor deposition from a tantalum pentafluoride precursor vapor, with intermittent ammonia plasma treatment of the tantalum and tantalum nitride such that each tantalum layer and each tantalum nitride layer are treated at least once to thereby reduce the evolution of HF gas, thereby improving the adhesion and durability of the film stacks during subsequent elevated temperature processing.

22 Claims, 11 Drawing Sheets

METHOD FOR IMPROVING THE ADHESION AND DURABILITY OF CVD TANTALUM AND TANTALUM NITRIDE MODULATED FILMS BY PLASMA TREATMENT

CROSS REFERENCE TO RELATED APPLICATIONS

This application is related to copending U.S. patent application Ser. No. 09/723,876 filed Nov. 28, 2000 entitled METHOD FOR PRETREATING DIELECTRIC LAYERS TO ENHANCE THE ADHESION OF CVD METAL LAYERS THERETO; U.S. patent application Ser. No. 09/723,878 filed Nov. 28, 2000 entitled METHOD FOR IMPROVING THE ADHESION OF SPUTTERED COPPER FILMS TO CVD TRANSITION METAL BASED UNDERLAYERS; U.S. patent application Ser. No. 09/300,165, now abandoned, entitled CVD TiN PLUG FORMATION FROM TITANIUM HALIDE PRECURSORS; U.S. patent application Ser. No. 09/300,658, now U.S. Pat. No. 6,265,311, entitled PECVD OF TaN FILMS FROM TANTALUM HALIDE PRECURSORS; U.S. patent application Ser. No. 09/300,661, now U.S. Pat. No. 6,410,433, entitled THERMAL CVD OF TaN FILMS FROM TANTALUM HALIDE PRECURSORS; U.S. patent application Ser. No. 09/300,583, now U.S. Pat. No. 6,413,860, entitled PECVD OF Ta FILMS FROM TANTALUM HALIDE PRECURSORS; U.S. patent application Ser. No. 09/300,659, now U.S. Pat. No. 6,268,288, and entitled PLASMA TREATED THERMAL CVD OF TaN FILMS FROM TANTALUM HALIDE PRECURSORS; and U.S. patent application Ser. No. 09/300,632, now U.S. Pat. No. 6,410,432, entitled CVD OF INTEGRATED TaN AND $TaN_x$ FILMS FROM TANTALUM HALIDE PRECURSORS.

FIELD OF THE INVENTION

This invention relates to adhesion and durability of tantalum/tantalum nitride modulated films used as a barrier to copper diffusion in the manufacture of semiconductor devices.

BACKGROUND OF THE INVENTION

The semiconductor industry is committed to introducing copper interconnects as a replacement for conventional aluminum and aluminum alloy interconnects in future generations of semiconductor devices. With its greater current carrying capacity, the introduction of copper interconnects should reduce device geometry, power consumption and heat generation. However, copper is a fast diffuser in silicon and drifts in dielectrics, resulting in a deterioration of devices at low temperatures. To avoid unwanted migration of copper atoms, a barrier layer or underlayer of a transition metal-based material, such as a tantalum-based material and more particularly tantalum and/or tantalum nitride, is typically used as a diffusion barrier between a copper interconnect layer and an underlying dielectric layer, such as a layer of silicon oxide. One method of providing the diffusion barrier is physical vapor deposition (PVD) by sputtering. However, sputter deposition, among other problems, cannot adequately cover the sidewalls of near-surface features having a high aspect ratio because sputtering is essentially a line-of-sight deposition process.

Two chemical vapor deposition (CVD) processes, thermal CVD (TCVD) and plasma-enhanced CVD (PECVD), are candidates to replace PVD. CVD provides highly uniform layers that conform to topographical features having high aspect ratios. TCVD is a high temperature process in which a flow of gaseous reactants over a heated semiconductor substrate chemically react to deposit a solid layer on the heated substrate. PECVD is a relatively low-temperature process which introduces a plasma to activate the gaseous reactants.

To deposit a transition metal-based barrier layer, both CVD processes react a vapor-phase reactant, for example a transition metal halide reagent such as a tantalum halide or titanium halide, with a reducing gas, for example a hydrogen-containing gas such as either hydrogen ($H_2$) or ammonia ($NH_3$). If, for example, the reducing gas is hydrogen and the vapor-phase reactant is a tantalum halide, tantalum (Ta) is deposited, while tantalum nitride ($TaN_x$) is deposited if the reducing gas is a nitrogen-containing gas, such as ammonia or a mixture of nitrogen and hydrogen.

The chemical reduction of the transition metal halide vapor-phase reactant produces halogen atoms as a by-product. The layer of transition metal-based material deposited by either of the CVD methods using a gas mixture comprising a transition metal halide vapor-phase reactant will incorporate a low residual level of the by-product halogen atoms as an unwanted impurity. For example, a layer of tantalum deposited on a substrate by PECVD using, for example, tantalum pentafluoride will usually contain an average of about 0.5 atomic percent of the residual halide, in this instance the residual halide being fluorine. Residual fluorine concentration may peak, however, near interfaces, in particular the barrier/dielectric interface and the barrier/copper interface.

An elevated concentration of halogen atoms present at the barrier/dielectric interface has been found to correlate with a significantly reduced adhesion of the transition metal-based layer to the underlying dielectric. Likewise, elevated halogen atom concentration at the barrier/copper interface has been found to correlate with reduced adhesion of copper to the transition metal-based layer. Halogen atoms significantly disrupt the atomic bonding at the interfaces between the transition metal-based layer and the dielectric or copper film so that the transition metal-based layer and the overlying copper layer are more likely to delaminate. A nitrogen-containing plasma pretreatment of the dielectric surface prior to CVD of the barrier layer has been proposed in copending application Ser. No. 09/723,876 entitled METHOD FOR PRETREATING DIELECTRIC LAYERS TO ENHANCE THE ADHESION OF CVD METAL LAYERS THERETO. The pretreatment provides nitrogen at the interface, which improves adhesion of a subsequently applied barrier layer. To address adhesion at the barrier/copper interface, a nitrogen-containing plasma post-treatment following CVD of the barrier layer has been proposed in copending application Ser. No. 09/723,878 entitled METHOD FOR IMPROVING THE ADHESION OF SPUTTERED COPPER FILMS TO CVD TRANSITION METAL BASED UNDERLAYERS. While these treatments are effective in improving adhesion at the barrier/dielectric interface and barrier/copper interface, respectively, the barrier films typically comprise a multi-layer stack having a plurality of internal interfaces that are also subject to delamination. Thus, further improvement in adhesion and durability is desirable at the Ta/TaN interfaces within a multi-layer or modulated Ta/TaN film stack.

There is thus a need for a CVD method that will prevent residual halogen impurities from altering the adhesion and durability of layers within a Ta/TaN modulated barrier layer deposited by a CVD process on a dielectric-covered substrate.

SUMMARY OF THE INVENTION

The present invention provides a method for forming modulated tantalum/tantalum nitride diffusion barrier stacks on semiconductor device substrates used in interconnect structures that reduces the evolution of HF gas, thereby improving the adhesion and durability of the film stacks during subsequent elevated temperature processing. To this end, and in accordance with the present invention, at least one series of alternating layers of tantalum and tantalum nitride is deposited onto the semiconductor device substrate by chemical vapor deposition from a tantalum pentafluoride precursor vapor, with intermittent ammonia plasma treatment of the tantalum and tantalum nitride such that each tantalum layer and each tantalum nitride layer are treated at least once.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

Figure 1:
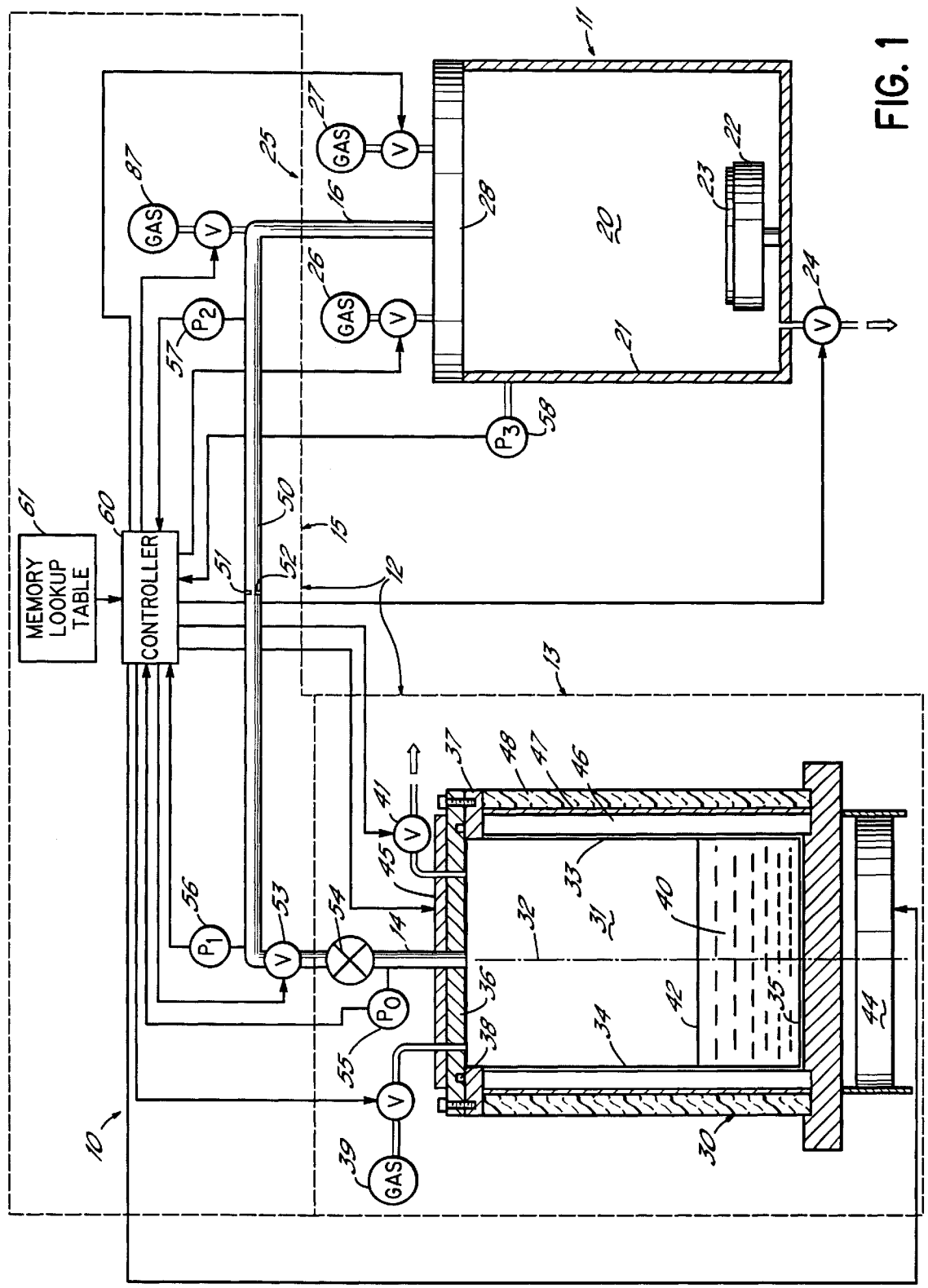
FIG. 1 is a side view, partially in cross-section, of a reactor used to practice the method of the present invention.
Figure 2:
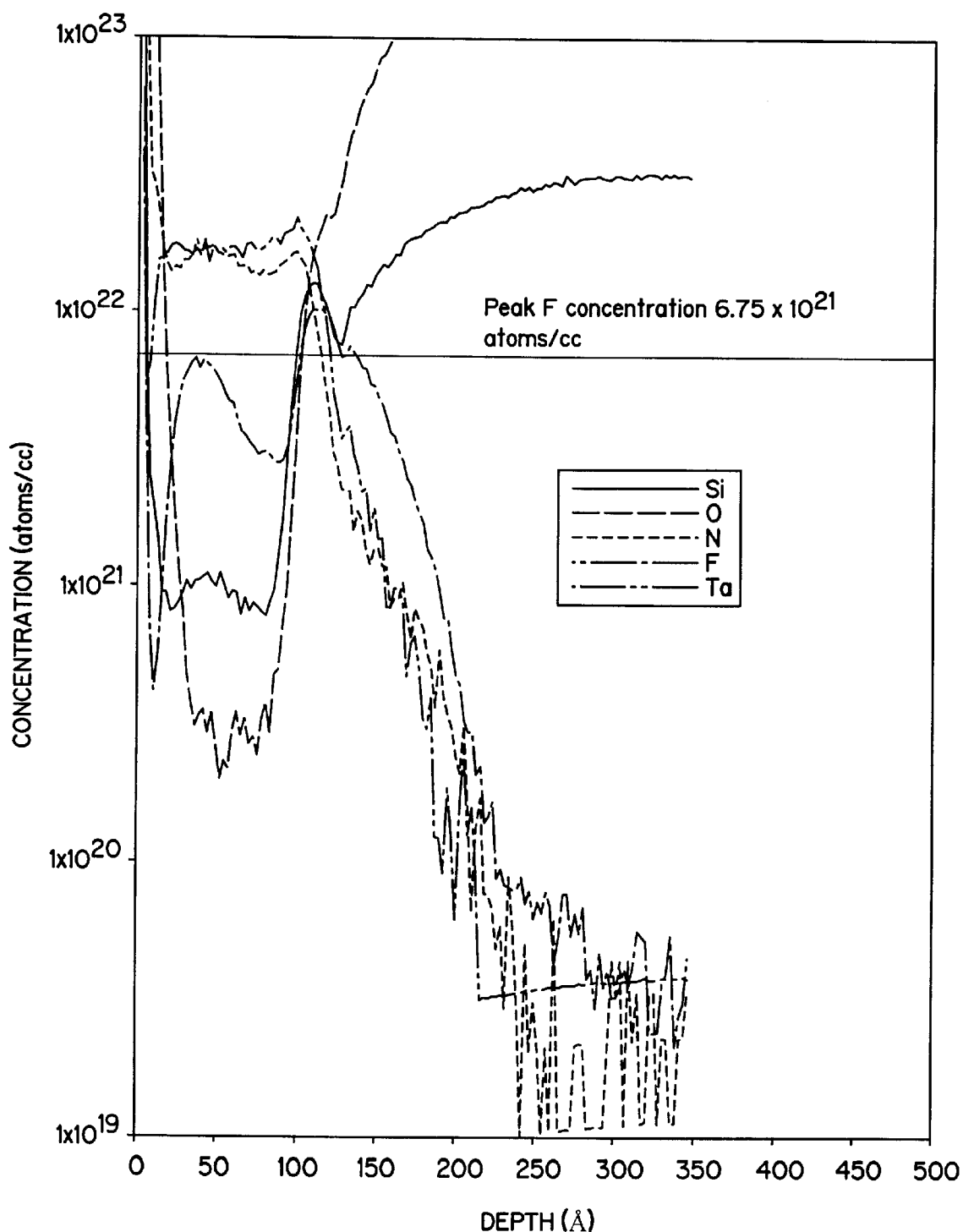
FIG. 2 is a SIMS depth profile of a 100 Å plasma treated modulated Ta/TaN film.

Refractory transition metals such as tantalum (Ta) or titanium (Ti) and their nitride films (TaN or TiN) are effective diffusion barriers to copper (Cu). Their effectiveness is due to their high thermal stability, high conductivity and resistance to diffusion of foreign elements or impurities. Ta and TaN are especially attractive due to their chemical inertness with Cu; no compounds form between Cu and Ta or Cu and N. Most advantageously, multiple alternating layers of Ta and TaN are deposited to optimize the effectiveness of the barrier film.

Tantalum halides provide a convenient inorganic source for CVD of Ta and TaN barrier layers. Specifically, the inorganic precursor is a tantalum pentahalide ($TaX_5$) where X represents the halides fluorine (F), chlorine (Cl) and bromine (Br). For low temperature CVD of Ta and TaN barrier layers, $TaF_5$ has become a preferred precursor. In chemical vapor deposition (CVD) processes, the gas precursors are activated using either thermal energy or electrical energy. Upon activation, the gas precursors react chemically to form a film. During this process, however, halogen atoms, in particular, fluorine atoms, generated during reaction of the precursor are incorporated into the deposited film.

The tantalum and tantalum nitride thin films must adhere to each other and to the underlying substrate during subsequent processing steps. The multi-layer tantalum and tantalum nitride thin films deposited by CVD on silicon dioxide substrates exhibited good adhesion as deposited. However, heating the films at temperatures of 400° C. and above resulted in delamination of the film. Bubbles were observed in the film when examined with an optical microscope. In some cases, the bubbles were intact. In other cases, the bubbles had exploded. Thermal desorption spectroscopy identified the evolution of hydrogen, nitrogen and hydrogen fluoride during heating of the modulated barrier films. It is theorized that out-gassing is the cause of the bubbles. Thus, the present invention provides a process by which the formation of bubbles in CVD tantalum and tantalum nitride modulated films is eliminated.

To this end, and in accordance with the present invention, CVD methods are used to deposit a modulated Ta/TaN barrier layer, for example, a TaN/Ta/TaN/Ta stack. The barrier layer is exposed intermittently during its formation within the CVD chamber to an ammonia plasma. The ammonia plasma reacts with fluorine atoms and hydrogen atoms trapped within the deposited barrier layer and effectively carries them away. Based on thermal desorption analysis, as stated above, it was suspected that the cause of adhesion failure of films deposited without intermittent plasma treatment was the evolution of hydrogen fluoride (HF) gas at elevated temperatures. The main source for the HF gas is thought to be a combination of fluorine in the TaN layers and hydrogen in the Ta layers of the modulated film stack. Thus, reducing the amount of fluorine and/or hydrogen atoms in the respective layers is believed to have the effect of reducing the evolution of HF gas and therefore reducing or eliminating the delamination within the film stack at elevated temperatures. After the modulated stack is formed, the substrate is transferred to a PVD module and the copper film is deposited onto the plasma-treated modulated barrier layer.

FIG. 1 depicts a chemical vapor deposition (CVD) system 10 that may be used in the present invention. System 10 includes a CVD reaction chamber 11 and a precursor delivery system 12. The particular embodiment of system 10 shown herein is provided only to illustrate operation of the invention and should not be used to limit the scope of the invention. In the reaction chamber 11, a reaction is carried out to convert a precursor gas of, for example, tantalum pentafluoride ($TaF_5$) or other tantalum halide compound, into a barrier layer film of tantalum (Ta) and tantalum nitride ($TaN_x$). The TaN film is not limited to any particular stoichiometry ($TaN_x$) because $TaN_x$ can be continuously varied by changing the ratio of the gases in any given deposition. Thus, as used herein, $TaN_x$ encompasses a tantalum nitride film of any stoichiometry.

The precursor delivery system 12 includes a source 13 of precursor gas having a gas outlet 14, which communicates through a metering system 15 with a gas inlet 16 to the CVD reaction chamber 11. The source 13 generates a precursor vapor, for example a tantalum halide vapor, from a tantalum halide compound. The compound is one that is in a solid state when at standard temperature and pressure. The precursor source is maintained, preferably by controlled heating, at a temperature that will produce a desired vapor pressure of precursor. Preferably, the vapor pressure is one that is itself sufficient to deliver the precursor vapor to the reaction chamber 11, preferably without the use of a carrier gas. The metering system 15 maintains a flow of the precursor gas vapor from the source 13 into the reaction chamber 11 at a rate that is sufficient to maintain a commercially viable CVD process in the reaction chamber 11.

The reaction chamber 11 is a generally conventional CVD reactor and includes a vacuum chamber 20 that is bounded by a vacuum tight chamber wall 21. In the chamber 20 is situated a substrate support or susceptor 22 on which a substrate such as a semiconductor wafer 23 is supported. The chamber 20 is maintained at a vacuum appropriate for the performance of a CVD reaction that will deposit a film such as a modulated Ta/TaN$_x$ barrier layer on the semiconductor wafer substrate 23. A preferred pressure range for the CVD reaction chamber 11 is in the range of from 0.2–5.0 Torr. The vacuum is maintained by controlled operation of a vacuum pump 24 and of inlet gas sources 25 that include the delivery system 12 and may also include reducing gas sources 26 of, for example, hydrogen ($H_2$), nitrogen ($N_2$) or ammonia ($NH_3$) for use in carrying out a tantalum reduction reaction, and an inert gas source 27 for a gas such as argon (Ar) or helium (He). The gases from the sources 25 enter the chamber 20 through a showerhead 28 that is situated at one end of the chamber 20 opposite the substrate 23, generally parallel to and facing the substrate 23.

The precursor gas source 13 includes a sealed evaporator 30 that includes a cylindrical evaporation vessel 31 having a vertically oriented axis 32. The vessel 31 is bounded by a cylindrical wall 33 formed of a high temperature tolerant and non-corrosive material such as the alloy INCONEL™ 600, the inside surface 34 of which is highly polished and smooth. The wall 33 has a flat circular closed bottom 35 and an open top, which is sealed by a cover 36 of the same heat tolerant and non-corrosive material as the wall 33. The outlet 14 of the source 13 is situated in the cover 36. When high temperatures are used, such as with TaBr$_5$, the cover 36 is sealed to a flange ring 37 that is integral to the top of the wall 33 by a high temperature tolerant vacuum compatible metal seal 38 such as a HELICOFLEX™ seal, which is formed of a C-shaped nickel tube surrounding an INCONEL™ coil spring. With materials requiring lower temperatures, such as TaCl$_5$ and TaF$_5$, a conventional elastomeric O-ring seal 38 maybe used to seal the cover.

Connected to the vessel 31 through the cover 36 is a source 39 of a carrier gas, which is preferably an inert gas such as He or Ar. The source 13 includes a mass 40 of precursor material such as tantalum fluoride, chloride or bromide (TaX), preferably as the pentahalide (TaX$_5$), at the bottom of the vessel 31, which is loaded into the vessel 31 at standard temperature and pressure in a solid state. The vessel 31 is filled with tantalum halide vapor by sealing the vessel 31 with the solid mass 40 of TaX therein. The halide is supplied as a precursor mass 40 that is placed at the bottom of the vessel 31, where it is heated, preferably to a liquid state as long as the resulting vapor pressure is in an acceptable range. Purge gas and TaX vapors are, however, first evacuated from the vessel 31 with a vacuum pump 41, which is connected through the cover 36, so that only TaX vapor from the TaX mass 40 remains in the vessel 31. Where the mass 40 is liquid, the vapor lies above the level of the liquid mass 40. Because wall 33 is a vertical cylinder, the surface area of TaX mass 40, if a liquid, remains constant regardless of the level of depletion of the TaX.

The delivery system 12 is not limited to direct delivery of a precursor 40 but can be used in the alternative for delivery of precursor 40 along with a carrier gas, which can be introduced into the vessel 31 from gas source 39. Such a gas may be hydrogen ($H_2$) or an inert gas such as helium (He) or argon (Ar). Where a carrier gas is used, it may be introduced into the vessel 31 so as to distribute across the top surface of the precursor mass 40 or may be introduced into the vessel 31 so as to percolate through the mass 40 from the bottom 35 of the vessel 31 with upward diffusion in order to achieve maximum surface area exposure of the mass 40 to the carrier gas. Yet another alternative is to vaporize a liquid that is in the vessel 31. However, such alternatives add undesired particulates and do not provide the controlled delivery rate achieved by the direct delivery of the precursor, that is, delivery without the use of a carrier gas. Therefore, direct delivery of the precursor is preferred.

Where it is desirable to introduce the precursor into the reaction chamber 11 through the showerhead 28 along with a carrier gas, it is preferred that the carrier gas be introduced into tube 50 near its outlet end, from a source 87 connected downstream of the downstream pressure sensor 57 of the metering system 15 so that it does not interfere with the accurate flow rate delivery of direct precursor delivery that is preferred with the system 10.

To maintain the temperature of the precursor 40 in the vessel 31, the bottom 35 of the wall 33 is maintained in thermal communication with a heater 44, which maintains the precursor 40 at a controlled temperature, preferably above its melting point, that will produce a vapor pressure of greater than about 3 Torr in the absence of a carrier gas (i.e., a direct delivery system), and a lower vapor pressure such as about 1 Torr when a carrier gas is used. The exact vapor pressure depends upon other variables such as the quantity of carrier gas, the surface area of the substrate 23, and so on. In a direct delivery system for tantalum, a vapor pressure can be maintained at the preferred pressure of 5 Torr or above by heating the tantalum halide precursor in the 83° C. to 218° C. range. For TaX$_5$, the desired temperature is about 83° C.–150° C., for example about 115° C. for TaF$_5$; the desired temperature is about 130° C.–150° C., for example about 145° C. for TaCl$_5$; and the desired temperature is about 202° C.–218° C., for example about 205° C. for TaBr$_5$. The melting points of the respective fluoride, chloride and bromide tantalum pentahalide compounds are in the 97° C. to 265° C. range. Temperatures should not be so high as to cause premature reaction of the gases in the showerhead 28 or otherwise before contacting the wafer 23.

For purposes of example, a temperature of 115° C. is assumed to be the control temperature for the heating of the bottom 35 of the vessel 31. Given this temperature at the bottom 35 of the vessel 31, to prevent condensation of the precursor vapor on the walls 33 and cover 36 of the vessel 31, the cover is maintained at the same or higher temperature than the heater 44 at the bottom 35 of the wall 33 of, for example, 115° C., by a separately controlled heater 45 that is in thermal contact with the outside of the cover 36. The sides of the vessel wall 33 are surrounded by an annular trapped air space 46, which is contained between the vessel wall 33 and a surrounding concentric outer aluminum wall or can 47. The can 47 is further surrounded by an annular layer of silicon foam insulation 48. This temperature maintaining arrangement maintains the vapor in a volume of the vessel 31 bounded by the cover 36, the sides of the walls 33 and the surface 42 of the precursor mass 40 at the desired temperature of about 115° C. and the pressure greater than about 3 Torr, preferably at greater than 5 Torr. The temperature that is appropriate to maintain the desired pressure will vary with the precursor material, which is primarily contemplated as a being a tantalum pentafluoride compound.

The vapor flow metering system 15 includes a delivery tube 50 of at least ½ inch in diameter, or at least 10 millimeters inside diameter, and preferably larger so as to provide no appreciable pressure drop at the flow rate desired, which is at least approximately 2 to 40 standard cubic centimeters per minute (sccm). The tube 50 extends from the precursor gas source 13 to which it connects at its upstream end to the outlet 14, to the reaction chamber 11 to which it connects at its downstream end to the inlet 16. The entire length of the tube 50 from the evaporator outlet 14 to the reactor inlet 16 and the showerhead 28 of the reaction chamber 11 are also preferably heated to above the evaporation temperature of the precursor material 40, for example, to 150° C.

In the tube 50 is provided baffle plate 51 in which is centered a circular orifice 52, which preferably has a diameter of approximately 0.089 inches. The pressure drop from gauge 56 to gauge 57 is regulated by control valve 53. This pressure drop after control valve 53 through orifice 52 and into reaction chamber 11 is greater than about 10 milliTorr and will be proportional to the flow rate. A shut-off valve 54 is provided in the line 50 between the outlet 14 of the evaporator 13 and the control valve 53 to close the vessel 31 of the evaporator 13.

Pressure sensors 55–58 are provided in the system 10 to provide information to a controller 60 for use in controlling the system 10, including controlling the flow rate of precursor gas from the delivery system 15 into the chamber 20 of the CVD reaction chamber 11. The pressure sensors include sensor 55 connected to the tube 50 between the outlet 14 of the evaporator 13 and the shut-off valve 54 to monitor the pressure in the evaporation vessel 31. A pressure sensor 56 is connected to the tube 50 between the control valve 53 and the baffle 51 to monitor the pressure upstream of the orifice 52, while a pressure sensor 57 is connected to the tube 50 between the baffle 51 and the reactor inlet 16 to monitor the pressure downstream of the orifice 52. A further pressure sensor 58 is connected to the chamber 20 of the reaction chamber 11 to monitor the pressure in the CVD chamber 20.

Control of the flow of precursor vapor into the CVD chamber 20 of the reaction chamber 11 is achieved by the controller 60 in response to the pressures sensed by the sensors 55–58, particularly the sensors 56 and 57 which determine the pressure drop across the orifice 52. When the conditions are such that the flow of precursor vapor through the orifice 52 is unchoked flow, the actual flow of precursor vapor through the tube 52 is a function of the pressures monitored by pressure sensors 56 and 57, and can be determined from the ratio of the pressure measured by sensor 56 on the upstream side of the orifice 52, to the pressure measured by sensor 57 on the downstream side of the orifice 52.

When the conditions are such that the flow of precursor vapor through the orifice 52 is choked flow, the actual flow of precursor vapor through the tube 52 is a function of only the pressure monitored by pressure sensor 57. In either case, the existence of choked or unchoked flow can be determined by the controller 60 by interpreting the process conditions. When the determination is made by the controller 60, the flow rate of precursor gas can be determined by the controller 60 through calculation.

Preferably, accurate determination of the actual flow rate of precursor gas is calculated by retrieving flow rate data from lookup or multiplier tables stored in a non-volatile memory 61 accessible by the controller 60. When the actual flow rate of the precursor vapor is determined, the desired flow rate can be maintained by a closed loop feedback control of one or more of the variable orifice control valve 53, the CVD chamber pressure through evacuation pump 24 or control of reducing or inert gases from sources 26 and 27, or by control of the temperature and vapor pressure of the precursor gas in vessel 31 by control of heaters 44, 45.

A parallel plate RF discharge is used where the driven electrode is the gas delivery showerhead and the susceptor 22 or stage for the wafer or substrate 23 is the RF ground. The selected $TaX_5$ vapor is combined with other process gases such as $H_2$ above the substrate, which is heated to a temperature between about 300° C.–500° C. Ar and He may also be used, either singularly or in combination, as process gases in addition to $H_2$, $NH_3$, and/or $N_2$.

The modulated films formed in the method of the present invention, such as with the above described CVD apparatus, comprise stacked layers of Ta and TaN. By way of example, the modulated film may comprise four stacked layers-TaN/Ta/TaN/Ta. The TaN layers are preferably deposited by TCVD and the Ta layers are preferably deposited by PECVD. The stoichiometry of the TaN layers may be varied by altering process parameters, and may be $Ta_3N_5$, for example. By way of further example, process conditions for deposition of good quality PECVD Ta films are given in Table 1, where slm is standard liters per minute and $W/cm^2$ is watts per centimeter squared.

TABLE 1

| | Range | Exemplary Value |
|---|---|---|
| Substrate Temperature | 300° C.–500° C. | 350° C. |
| $TaF_5$ Temperature | 83° C.–150° C. | 115° C. |
| $TaF_5$ Flow | 1–50 sccm | 30 sccm |
| $H_2$ Flow | 1–10 slm | 1.5 slm |
| Ar, He Flow | 0–10 slm | 0 slm He, 550 sccm Ar |
| Process Pressure | 0.2–5.0 Torr | 2 Torr |
| RF Power | 0.1–5.0 $W/cm^2$ | 250 W |

Process conditions for deposition of good quality PECVD $TaN_x$ films are given in Table 2.

TABLE 2

| | Range | Exemplary Value |
|---|---|---|
| Substrate Temperature | 300° C.–500° C. | 350° C. |
| $TaF_5$ Temperature | 83° C.–150° C. | 115° C. |
| $TaF_5$ Flow | 1–50 sccm | 30 sccm |
| $H_2$ Flow | 1–10 slm | 1.5 slm |
| $N_2$ Flow | 0.1–10 slm | 0.2 slm |
| Ar, He Flow | 0–10 slm | 0 slm He, 550 sccm Ar |
| Process Pressure | 0.2–5.0 Torr | 2 Torr |
| RF Power | 0.1–5.0 $W/cm^2$ | 250 W |

Process conditions for deposition of good quality thermal CVD $TaN_x$ films are given in Table 3.

TABLE 3

| | Range | Exemplary Value |
|---|---|---|
| Substrate Temperature | 300° C.–500° C. | 350° C. |
| $TaF_5$ Temperature | 83° C.–150° C. | 115° C. |
| $TaF_5$ Flow | 1–50 sccm | 10 sccm |
| $H_2$ Flow | 0–10 slm | 1.5 slm |
| Ar, He Flow | 0–10 slm | 0 slm He, 200 sccm Ar |
| Process Pressure | 0.2–5.0 Torr | 2 Torr |

TABLE 3-continued

| | Range | Exemplary Value |
|---|---|---|
| NH₃ Flow | 0.1–10 slm | 0.5 slm |
| N₂ Flow | 0–10 slm | 0 slm |

The integrated films deposited by the above methods display characteristics important to the formation of an IC. The stacked film is in the range of low enough electrical resistivity for low interconnect impedances (less than 1000 $\mu\Omega$cm and preferably less than 500 $\mu\Omega$cm), and the stacked film has good conformality and good step coverage (greater than 0.3). Also, the deposition rates are sufficient for throughput considerations (greater than 100 Å/min) and the process uses a low wafer temperature (less than 450° C.) and thus is compatible with other thin film materials used within the device including materials with dielectric constants lower than that of $SiO_2$.

For the above described CVD processes using tantalum pentafluoride as the vapor-phase reactant, the residual level of fluorine is less than about 2 atomic percent, and typically about 0.5 atomic percent. Higher fluorine content peaks, for example up to 5 atomic percent, may occur at the dielectric barrier interface, Ta/TaN interfaces, and the barrier/copper interface. This residual halide impurity decreases the adherence and durability of the entire structure during subsequent processing, including during the subsequent application of a PVD copper layer to the modulated barrier layer.

In accordance with the present invention, the ammonia plasma treatment is applied to the barrier layer intermittently during the stack formation. The treatment comprises heating the substrate 23 having the Ta or TaN layer thereon to a predetermined temperature and exposing the layer to a plasma excited from an ammonia process gas as provided within reaction chamber 11. The parameters for the plasma treatment are a substrate temperature ranging between about 150° C. to about 500° C., for example about 350° C.; an ammonia gas flow rate of between about 50 sccm to about 10,000 sccm, for example about 2000 sccm; a reducing gas flow rate ranging from about 0 sccm to about 10,000 sccm, for example about 2000 sccm of hydrogen; an inert gas flow rate from about 0 sccm to about 2000 sccm, for example about 550 sccm of argon; a reactor pressure ranging from about 0.2 Torr to about 20 Torr, for example about 2 Torr; and an RF power ranging from about 50 Watts to about 2500 Watts, for example about 250 Watts. The process time of plasma treatment effective for enhancing the adhesion and durability of the modulated layers ranges from about 2 seconds to about 600 seconds per treatment, for example about 60 seconds of plasma exposure. The conditions for the plasma treatment are summarized in Table 4.

TABLE 4

| | Minimum Value | Maximum Value | Exemplary Value |
|---|---|---|---|
| Temperature (° C.) | 150 | 500 | 350 |
| Ammonia Flow (sccm) | 50 | 10000 | 2000 |
| Hydrogen Flow (sccm) | 0 | 10000 | 2000 |
| Argon Flow (sccm) | 0 | 2000 | 550 |
| Total Pressure (Torr) | 0.2 | 20 | 2 |
| RF Power (W) | 50 | 2500 | 250 |
| Time (sec.) | 2 | 600 | 60 |

The intermittent plasma treatment is performed in the same reactor in which the modulated barrier layer is being deposited by a CVD process.

The flow of inert gas, such as argon or xenon, is optional for the function of aiding in plasma initiation and maintenance and can be eliminated if that function is not needed. The inclusion of hydrogen with the ammonia treatment gas atmosphere is optional.

The modulated film deposition may be preceded by an ammonia plasma pre-treatment used to improve the adhesion at the barrier/dielectric interface. This treatment is described in copending application Ser. No. 09/723,876 entitled METHOD FOR PRETREATING DIELECTRIC LAYERS TO ENHANCE THE ADHESION OF CVD METAL LAYERS THERETO, filed on Nov. 28, 2000, and incorporated by reference herein in its entirety. After the optional pre-treatment, a first stack layer is applied, a plasma is generated in the CVD chamber in accordance with the present invention, then a next stack layer is formed and the plasma treatment repeated. The formation of the stack with the intermittent plasma treatment is repeated until a desired thickness and configuration of the barrier layer is formed. By way of example and not limitation, the method of the present invention may include the following sequence: deposit 25 Å TaN by TCVD; NH₃ plasma treat deposited TaN; deposit 25 Å TaN by TCVD; NH₃ plasma treat deposited TaN; deposit 25 Å Ta by PECVD; NH₃ plasma treat deposited Ta; deposit 25 Å Ta by PECVD; and NH₃ plasma treat deposited Ta. By this sequence, a 100 Å modulated TaN/Ta barrier film is formed with intermittent plasma treatment every 25 Å.

The ammonia plasma treatment of each layer of the modulated TaN/Ta film has the effect of increasing the durability of the film during high temperature annealing. Subsequent processing steps require that any film used for the purpose of a copper diffusion barrier must be able to withstand temperatures of at least 450° C. Film adhesion may be evaluated using a scratch and tape adhesion test during which the film is scratched with a diamond-tipped scribe, adhesive tape is applied to the scribed area, and the tape is removed. A film having good adhesion will remain adhered to the substrate, and a film having poor adhesion will be removed from the substrate by the tape.

A 200 Å modulated TaN/Ta film (50 Å TaN/50 Å Ta/50 Å TaN/50 Å Ta) not treated with the intermittent plasma treatments of the present invention was found to fail the scratch and tape adhesion test after annealing in nitrogen for 30 minutes at 400° C. A 200 Å modulated TaN/Ta film deposited under the same conditions but including the ammonia plasma layer intermittent treatments of the present invention was found to pass the scratch and tape adhesion test after annealing in nitrogen for 30 minutes at 450° C.

A 100 Å modulated TaN/Ta film (25 Å TaN/25 Å Ta/25 Å TaN/25 Å Ta) not treated with the intermittent plasma treatments of the present invention was found to fail the scratch and tape adhesion test after annealing in nitrogen for 30 minutes at 500° C. A 100 Å modulated TaN/Ta film deposited under the same conditions but including the ammonia plasma layer intermittent treatments of the present invention was found to pass the scratch and tape adhesion test after annealing in nitrogen for 30 minutes at 550° C.

Figure 3:
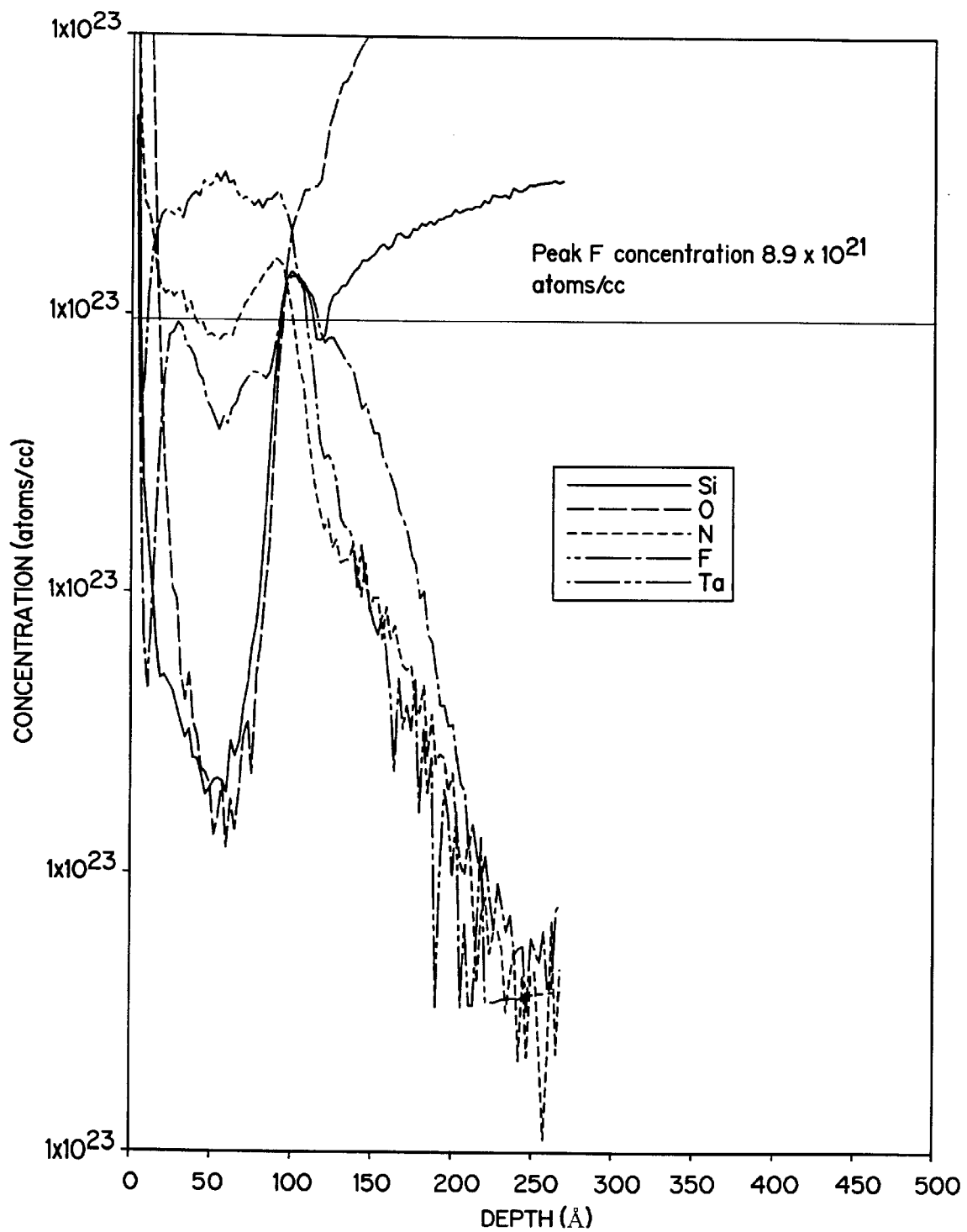
FIG. 3 is a SIMS depth profile of a 100 Å untreated modulated Ta/TaN film.
Figure 4:
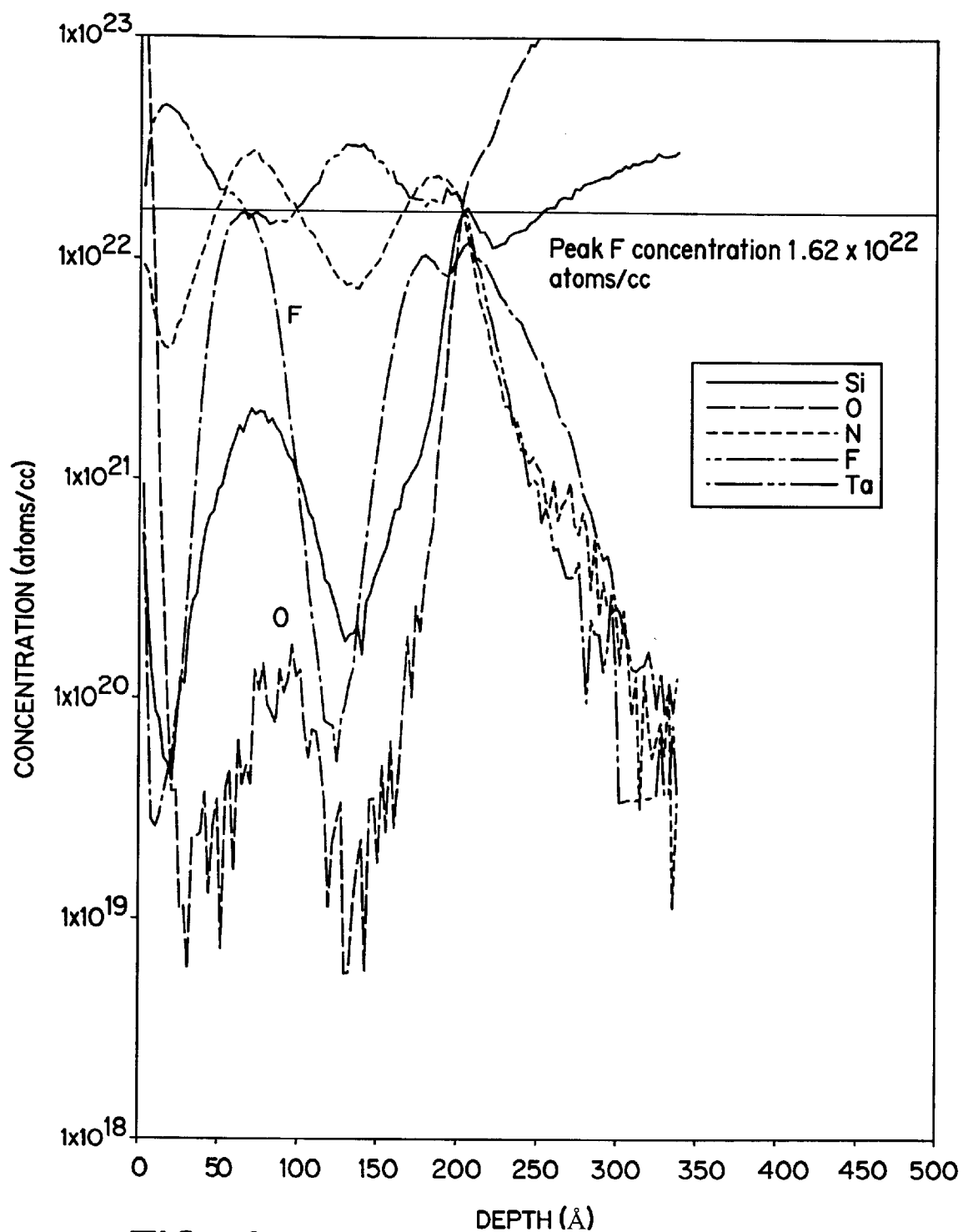
FIG. 4 is a SIMS depth profile of a 200 Å plasma treated Ta/TaN modulated film.
Figure 5:
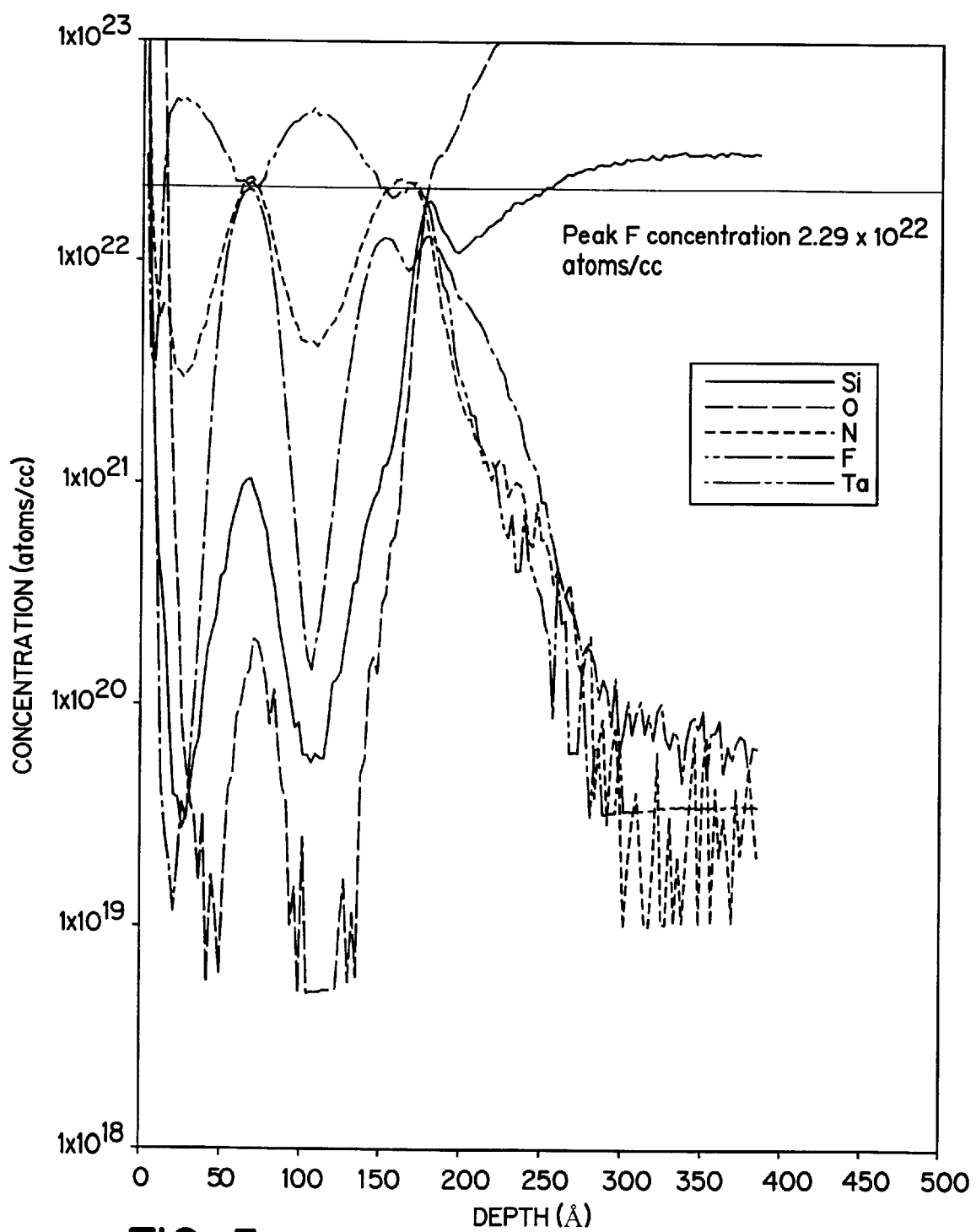
FIG. 5 is a SIMS depth profile of a 200 Å untreated modulated Ta/TaN film.

The mechanism by which the ammonia plasma layer treatment works was investigated using different analytical techniques. Based on previous experience, it was theorized that the plasma treatment was lowering the fluorine concentration in the TaN layers. This has been confirmed with secondary ion mass spectroscopy (SIMS) on wafers having 100 Å and 200 Å modulated films without the ammonia plasma intermittent treatment of the present invention and with the ammonia plasma intermittent treatment of the present invention. The SIMS depth profiles for the four wafers are shown in FIGS. 2–5. The peak fluorine levels in the TaN layers are 24% lower in the 100 Å plasma treated films (FIG. 2) and 29% lower in the 200 Å plasma treated films (FIG. 4) than in the untreated films (FIGS. 3 and 5, respectively).

Figure 6:
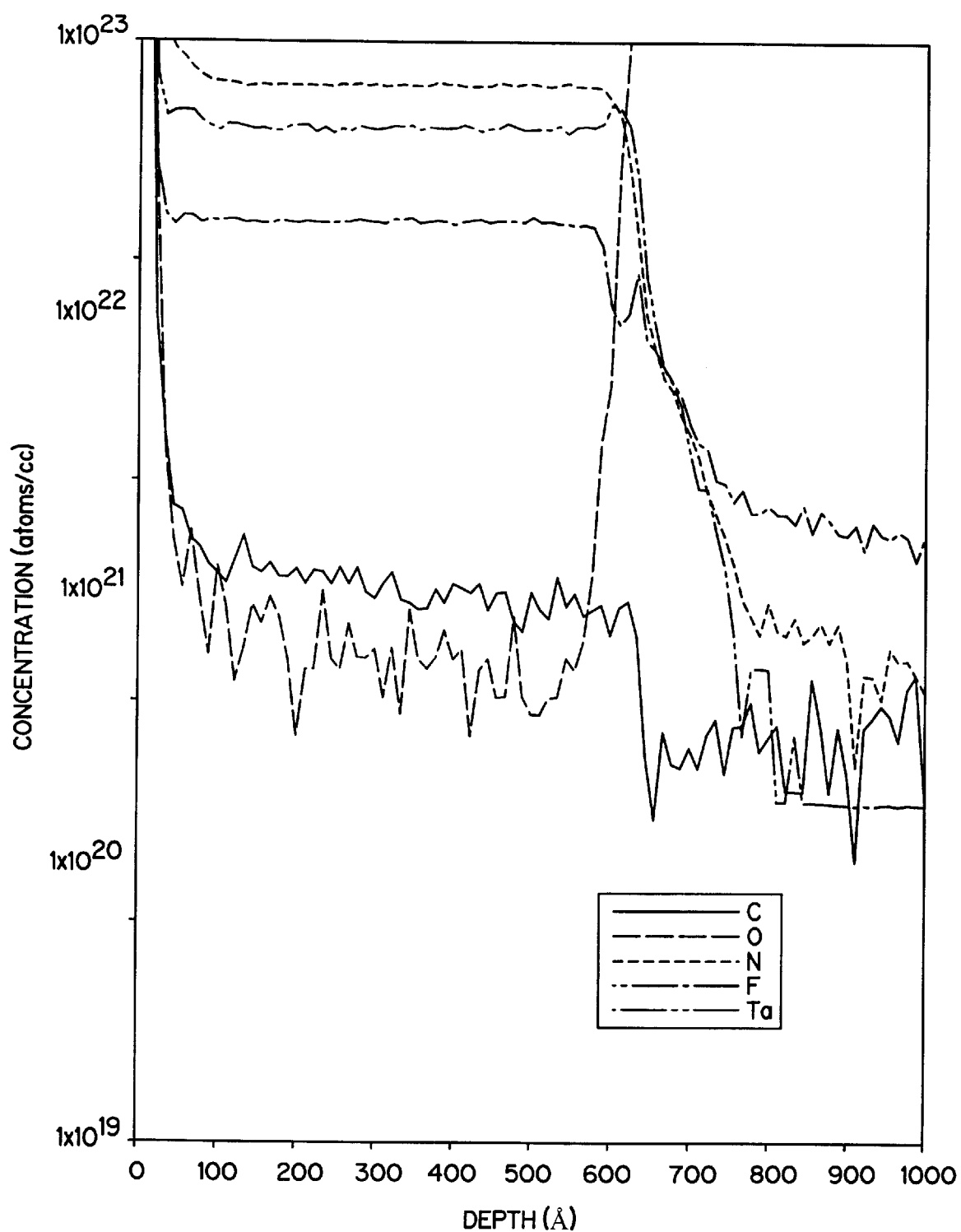
FIG. 6 is a SIMS depth profile of an untreated TaN film.
Figure 7:
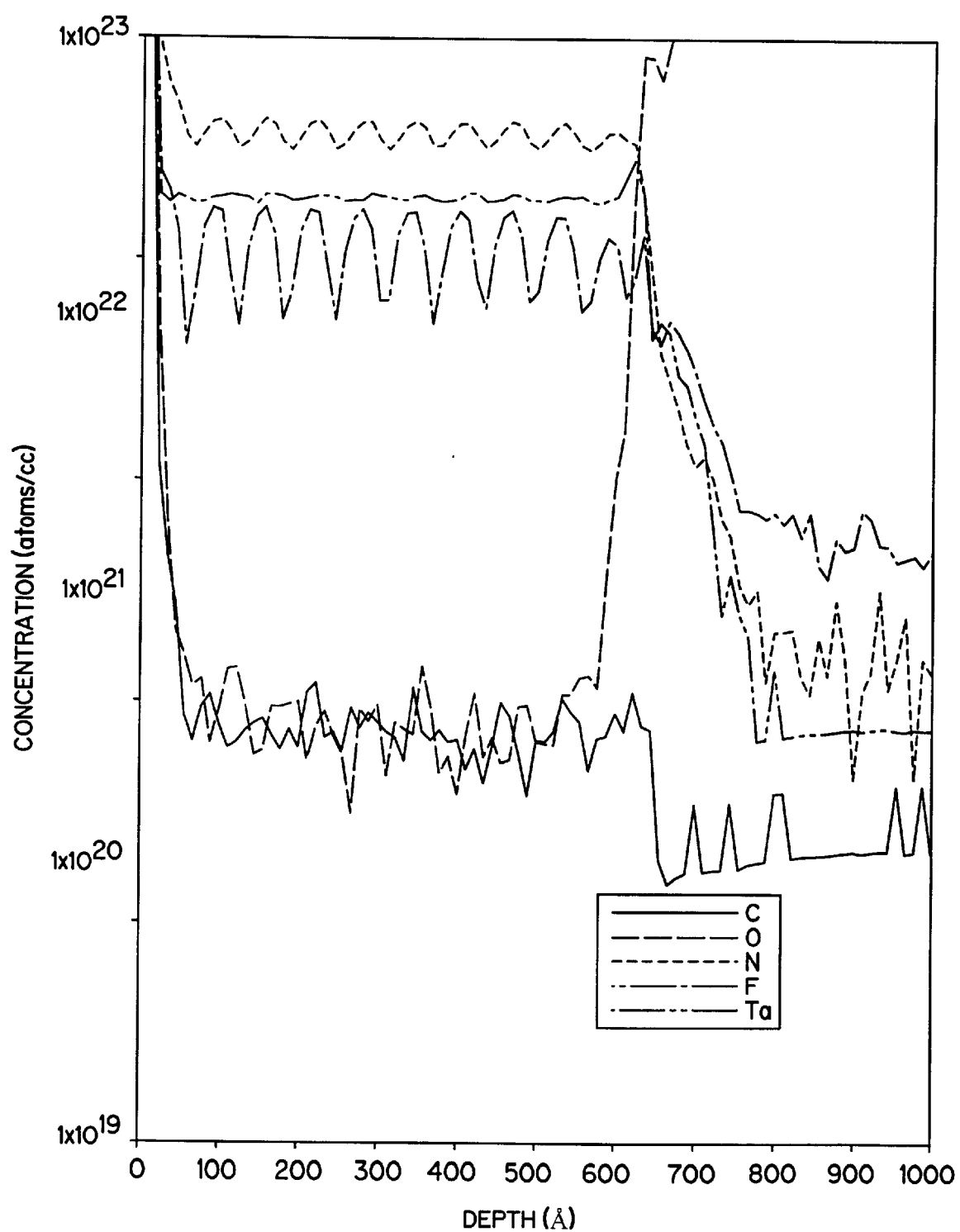
FIG. 7 is a SIMS depth profile of a TaN film plasma treated every 50 Å.
Figure 8:
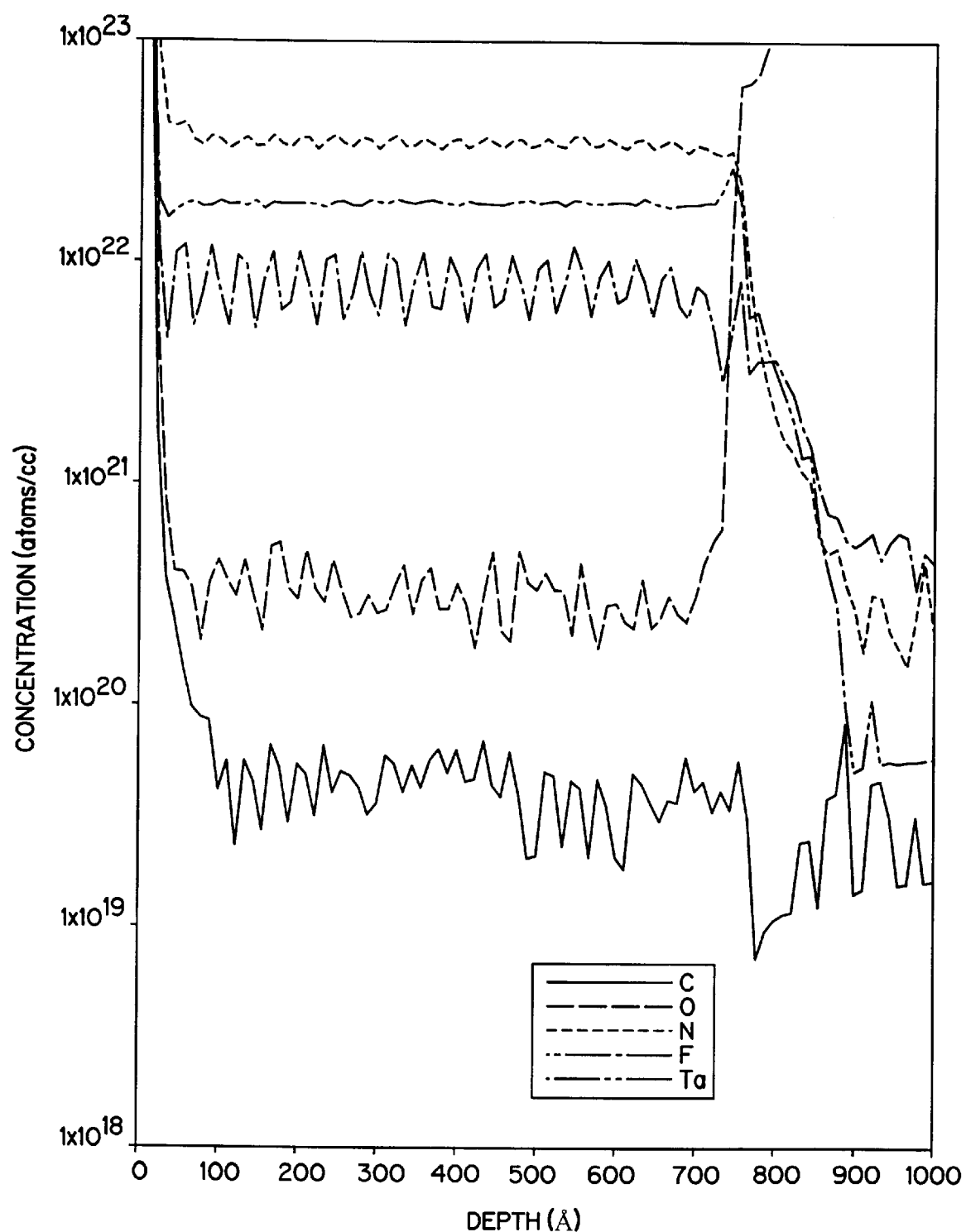
FIG. 8 is a SIMS depth profile of a TaN film plasma treated every 25 Å.

To examine the individual effect of the treatment of the TCVD TaN film, TCVD TaN films were deposited and treated with the ammonia plasma every 25 Å or every 50 Å. These films were analyzed by SIMS and Rutherford Backscattering Spectroscopy (RBS). A SIMS depth profile for the untreated TaN film is shown in FIG. 6, and SIMS depth profiles for the TaN films treated every 50 Å and every 25 Å are shown in FIGS. 7 and 8, respectively. The SIMS analysis shows that treating the TaN film at both 25 Å and 50 Å increments resulted in a reduction in the average fluorine concentration. The SIMS depth profiles also showed that the fluorine concentration reduction was also related to the length and number of plasma treatment steps. The plasma treatment reduced the fluorine concentration more when the treatments were applied every 25 Å, as shown in FIG. 8, than when they were applied every 50 Å, as shown in FIG. 7. The range of fluorine calibration used for the SIMS depth profile made the determination of the precise fluorine concentration uncertain. Thus, RBS was also used to determine the average fluorine concentration of the TaN films. Table 5 shows the reduction in fluorine as measured by RBS. Both the SIMS and RBS analysis show that the plasma treatment is effective at reducing the fluorine atomic fraction from that present in an untreated TaN layer, and is even more effective at reducing the fluorine concentration when used every 25 Å than when used every 50 Å.

TABLE 5

| Sample | F Atomic Fraction |
|---|---|
| Untreated TaN | 0.14 |
| TaN with plasma treatment every 50 Å | 0.11 |
| TaN with plasma treatment every 25 Å | 0.07 |

Figure 9:
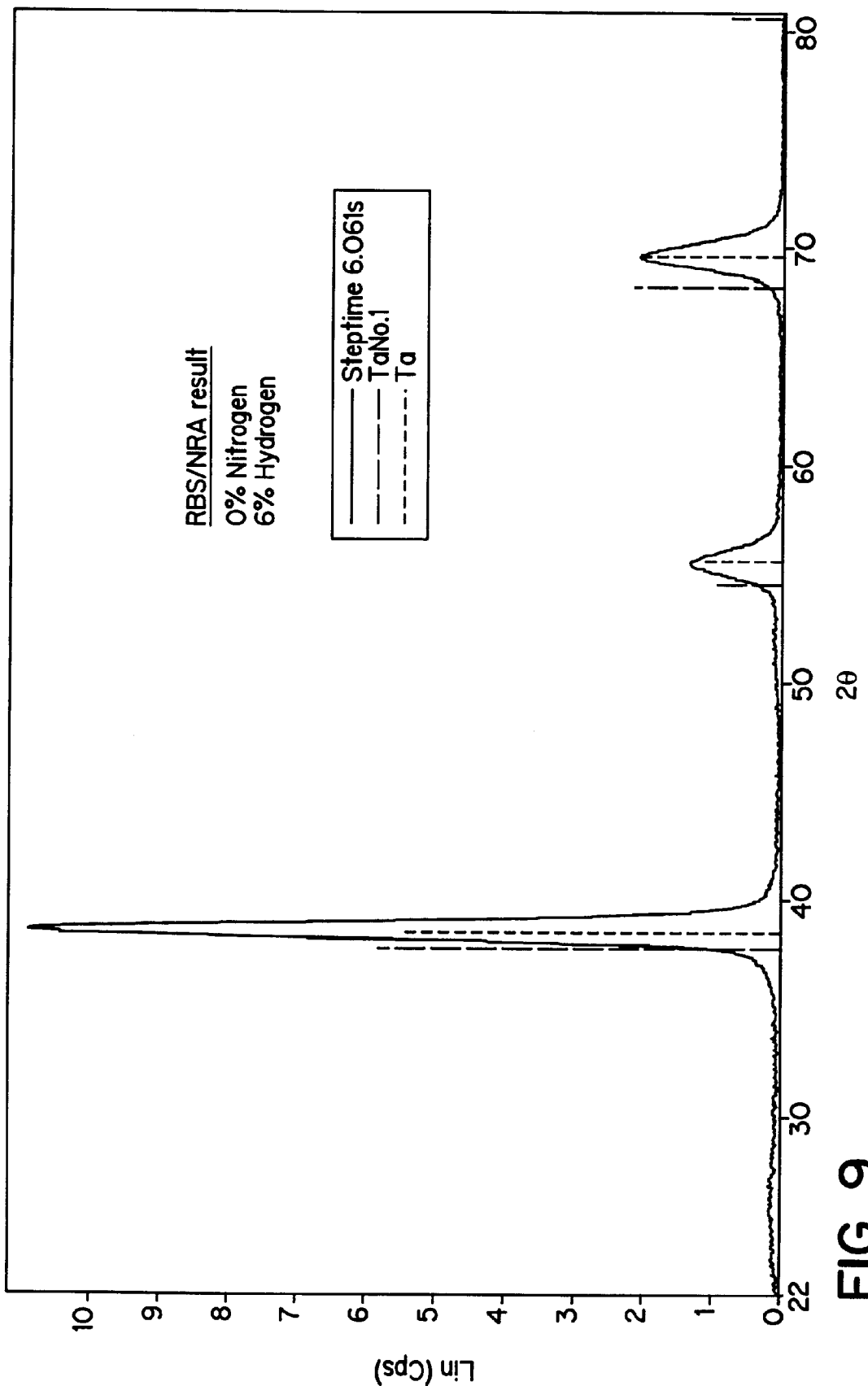
FIG. 9 is an XRD spectrum of an untreated PECVD Ta film.
Figure 10:
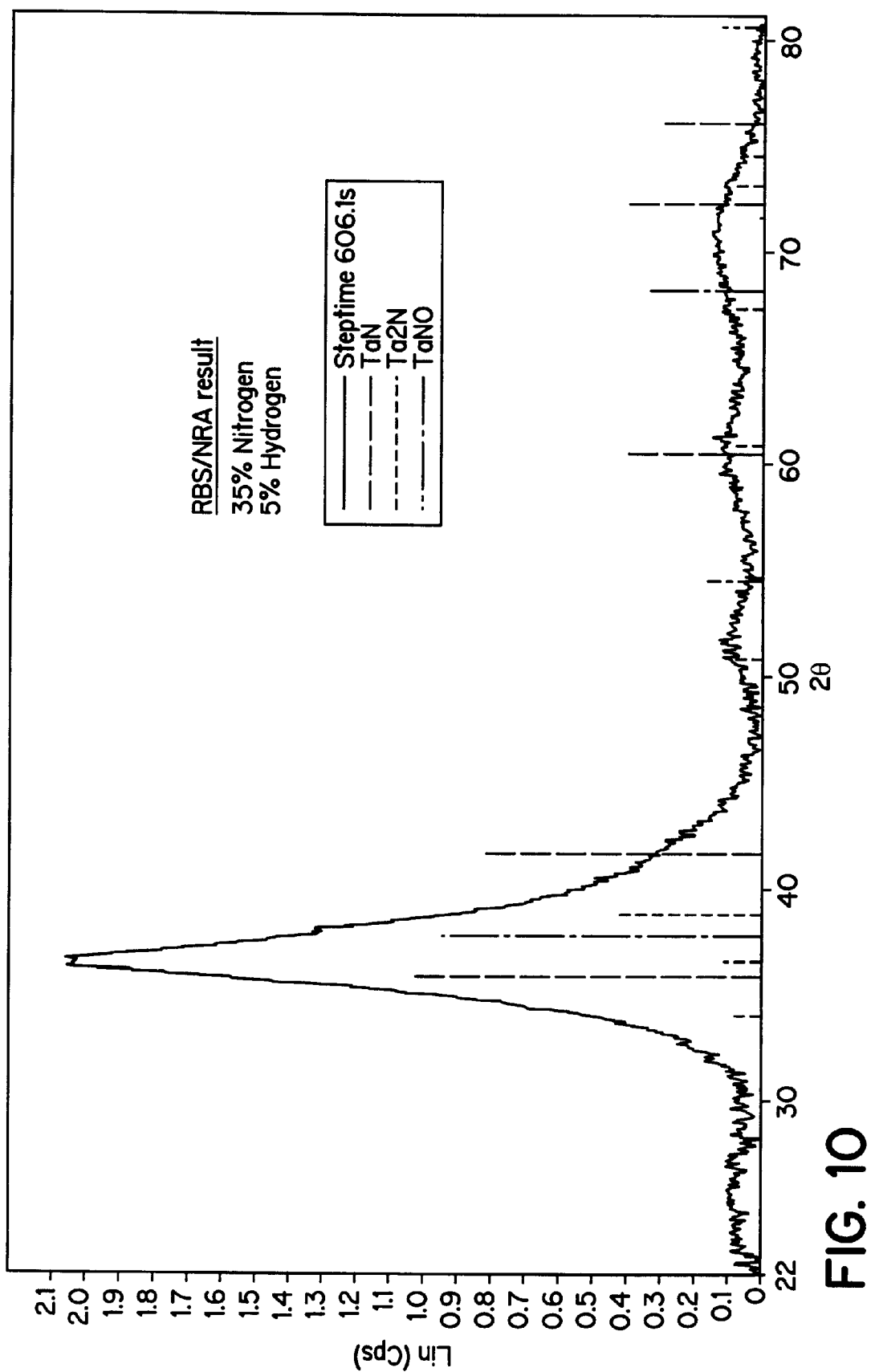
FIG. 10 is an XRD spectrum of a PECVD Ta film plasma treated every 50 Å.
Figure 11:
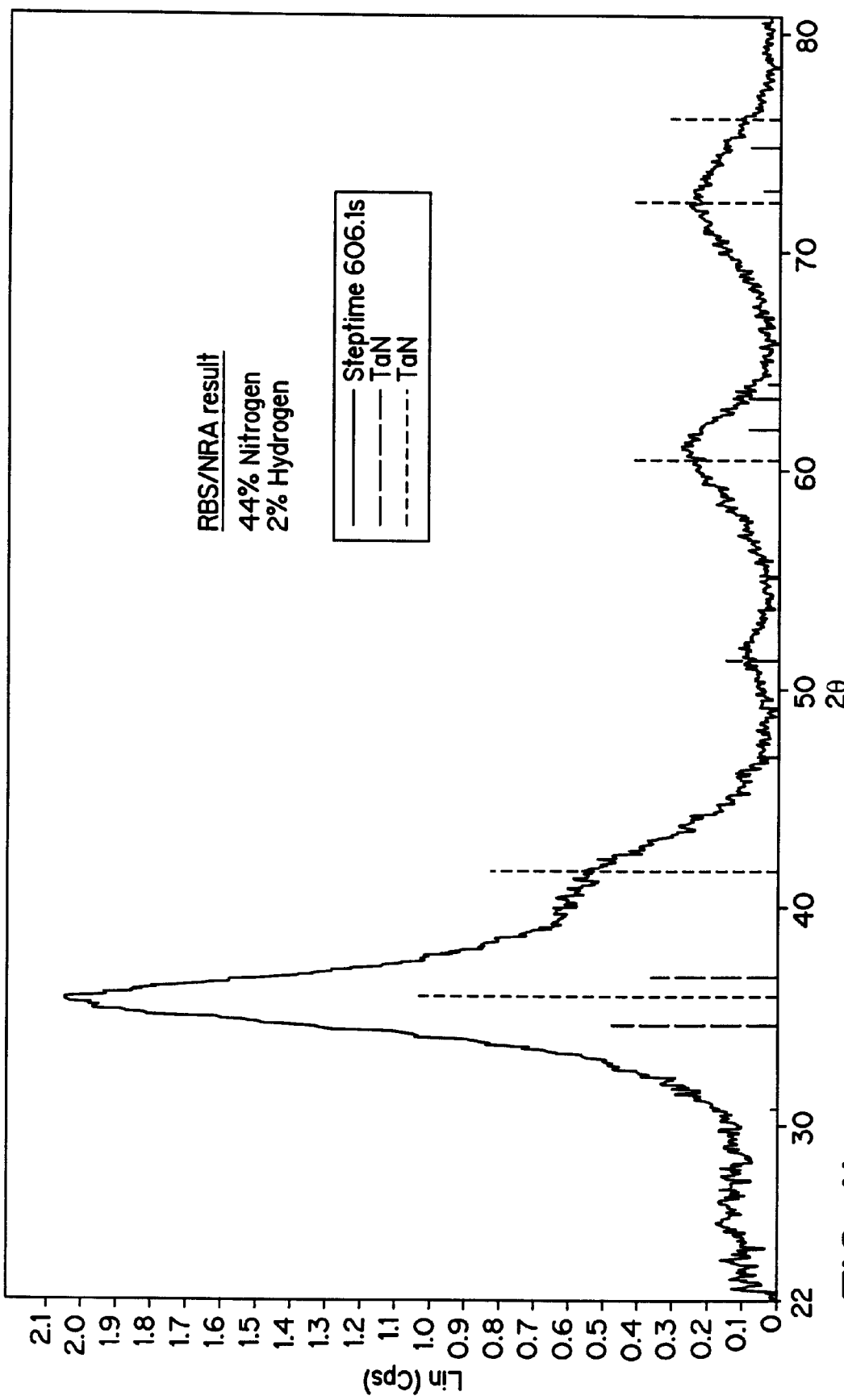
FIG. 11 is an XRD spectrum of a PECVD Ta film plasma treated every 25 Å.

The ammonia plasma also had the effect of nitriding the PECVD tantalum layers. This was confirmed with RBS and X-ray diffraction (XRD) analysis performed on PECVD Ta films, which were treated with the ammonia plasma every 25 Å or every 50 Å. FIG. 9 shows the XRD spectrum for untreated PECVD tantalum, and FIGS. 10 and 11 show the XRD spectra of the plasma treated PECVD tantalum films treated every 50 Å and every 25 Å, respectively. The XRD spectra show the atomic fractions of nitrogen and hydrogen determined by RBS and nuclear reaction analysis (NRA). The nitrogen content of the tantalum film was increased from 0% for the untreated tantalum film (FIG. 9) to 35% for the film treated every 50 Å (FIG. 10) and to 44% for the film treated every 25 Å (FIG. 11). The hydrogen content of the film was also reduced with increasing plasma treatments. The crystal structure of the untreated film was body centered cubic (BCC) $TaN_{0.05}$, while the plasma treated films had a face centered cubic (FCC) TaN crystal structure. The sample that was treated every 25 Å was more crystalline than the sample treated every 50 Å. This XRD data confirms that the nitrogen detected by the RBS analysis was incorporated into the tantalum film forming a new TaN phase.

As explained above, it was suspected that the cause of the adhesion failure of the modulated films deposited without the intermittent plasma treatment of the present invention was the evolution of hydrogen fluoride (HF) gas at subsequent elevated temperature processing. The source of the HF gas was thought to be a combination of fluorine in the TaN layers and hydrogen in the Ta layers of the modulated film stack. The analysis of the individual Ta and TaN films set forth above does indeed show that the plasma treatment reduces the fluorine content of the TaN and the hydrogen content of the Ta films, and nitrides the Ta films. Thus, reducing the amount of fluorine and hydrogen in the respective layers by the intermittent treatment of the present invention has had the effect of reducing the evolution of HF gas and therefore reducing or eliminating stack delamination occurring at elevated temperatures. When applied to the individual Ta and TaN layers of the modulated film, the plasma treatment has had the effect of increasing the durability of the films at subsequent elevated processing temperatures.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for forming a modulated tantalum/tantalum nitride diffusion barrier stack on a semiconductor device substrate for use in an interconnect structure, the method comprising:

depositing on the substrate at least one series of alternating layers of tantalum and tantalum nitride by chemical vapor deposition from a tantalum pentafluoride precursor vapor; and during said depositing, intermittently treating said tantalum and said tantalum nitride with an ammonia plasma, wherein each tantalum layer and each tantalum nitride layer are treated at least once.

2. The method of claim 1 wherein said plasma treating is repeated after every deposition of substantially 50 Å or less.

3. The method of claim 1 wherein said plasma treating is repeated after every deposition of substantially 25 Å.

4. The method of claim 1 wherein each of the intermittent plasma treatments is effected for a time in the range of about 2 seconds to about 600 seconds.

5. The method of claim 1 wherein said plasma treating includes providing ammonia at a flow rate of about 50–10,000 sccm.

6. The method of claim 1 wherein said plasma treating includes providing ammonia at a flow rate of about 2,000 sccm.

7. The method of claim 1 wherein said depositing of alternating layers includes depositing the tantalum layers by PECVD by exciting a plasma from the tantalum pentafluoride precursor and a hydrogen process gas.

8. The method of claim 1 wherein said depositing of alternating layers includes depositing the tantalum layers by TCVD by reacting the tantalum pentafluoride precursor and an ammonia process gas.

9. The method of claim 1 wherein each of the intermitted plasma treatments includes providing ammonia at a flow rate of about 50–10000 and providing an RF power of about 50–2500 W for a treatment time of about 2–600 seconds.

10. The method of claim 1 wherein said depositing of alternating layers includes depositing a first layer of about 25–50 Å tantalum nitride, depositing a second layer of about 25–50 Å tantalum, depositing a third layer of about 25–50 Å tantalum nitride, and depositing a fourth layer of about 25–50 Å tantalum, and wherein said plasma treating is effected between depositing the first and second layers, between depositing the second and third layers, between depositing the third and fourth layers, and after depositing the fourth layer.

11. The method of claim 1 wherein said depositing of alternating layers includes depositing a first layer of about 25 Å tantalum nitride, depositing a second layer of about 25 Å tantalum, depositing a third layer of about 25 Å tantalum nitride, and depositing a fourth layer of about 25 Å tantalum, and wherein the plasma treating is effected between depositing the first and second layers, between depositing the second and third layers, between depositing the third and fourth layers, and after depositing the fourth layer.

12. The method of claim 1 wherein said depositing of alternating layers includes depositing a first layer of about 50 Å tantalum nitride, depositing a second layer of about 50 Å tantalum, depositing a third layer of about 50 Å tantalum nitride, and depositing a fourth layer of about 50 Å tantalum, and wherein the plasma treating is effected substantially every 25 Å.

13. A method for forming a modulated tantalum/tantalum nitride diffusion barrier stack on a semiconductor device substrate for use in interconnect structure, the method comprising:

depositing on the substrate having a temperature in the range of about 300° C.–500° C. at least one series of alternating layers of tantalum and tantalum nitride by providing a vapor of a tantalum pentafluoride precursor to a reaction chamber containing said substrate by heating said precursor to a temperature sufficient to vaporize said precursor, then combining said vapor with a process gas to deposit said layers on said substrate, wherein the tantalum nitride is deposited by a method selected from the group consisting of: (a) plasma enhanced chemical vapor deposition (PECVD) including combining said vapor with said process gas consisting essentially of $N_2$ and $H_2$ and optional inert gases, and b) thermal chemical vapor deposition (TCVD) including combining said vapor with an ammonia process gas and optional inert gas, and wherein the tantalum is deposited by plasma enhanced chemical vapor deposition (PECVD) including combining said vapor with a hydrogen process gas and optional inert gases, and during said depositing, intermittently treating said tantalum and said tantalum nitride with an ammonia plasma, wherein each tantalum layer and each tantalum nitride layer are treated at least once.

14. The method of claim 13 wherein said plasma treating is repeated after every deposition of substantially 50 Å or less.

15. The method of claim 13 wherein the plasma treating is repeated after every deposition of substantially 25 Å.

16. The method of claim 13 wherein each of the intermittent plasma treatments is effected for a time in the range of about 2 seconds to about 600 seconds.

17. The method of claim 13 wherein said plasma treating includes providing ammonia at a flow rate of about 50–10,000 sccm.

18. The method of claim 13 wherein said plasma treating includes providing ammonia at a flow rate of about 2,000 sccm.

19. The method of claim 13 wherein each of the intermittent plasma treatments includes providing ammonia at a flow rate of about 50–10,000 and providing an RF power of about 50–2500 W for a treatment time of about 2–600 seconds.

20. The method of claim 13 wherein said depositing of alternating layers includes depositing a first layer of about 25–50 Å tantalum nitride, depositing a second layer of about 25–50 Å tantalum, depositing a third layer of about 25–50 Å tantalum nitride, and depositing a fourth layer of about 25–50 Å tantalum, and wherein the plasma treating is effected between depositing the first and second layers, between depositing the second and third layers, between depositing the third and fourth layers, and after depositing the fourth layer.

21. The method of claim 13 wherein said depositing of alternating layers includes depositing a first layer of about 25 Å tantalum nitride, depositing a second layer of about 25 Å tantalum, depositing a third layer of about 25 Å tantalum nitride, and depositing a fourth layer of about 25 Å tantalum, and wherein the plasma treating is effected between depositing the first and second layers, between depositing the second and third layers, between depositing the third and fourth layers and after depositing the fourth layer.

22. The method of claim 13 wherein said depositing of alternating layers includes depositing a first layer of about 50 Å tantalum nitride, depositing a second layer of about 50 Å tantalum, depositing a third layer of about 50 Å tantalum nitride, and depositing a fourth layer of about 50 Å tantalum, and wherein the plasma treating is effected substantially every 25 Å.

\* \* \* \* \*

UNITED STATES PATENT AND TRADEMARK OFFICE
CERTIFICATE OF CORRECTION

PATENT NO.    : 6,500,761 B1
DATED         : December 31, 2002
INVENTOR(S)   : Wajda et al.

It is certified that error appears in the above-identified patent and that said Letters Patent is hereby corrected as shown below:

Column 6,
Line 67, reads "contemplated as a being" and should read -- contemplated as being a --.

Column 7,
Line 17, reads "0.089 inches." and should read -- 0.089 inch. --

Column 12,
Line 25, reads "spirit of applicant's" and should read -- spirit of applicants' --.
Line 61, reads "each of the intermitted" and should read -- each of the intermittent --.
Line 63, reads "50-10000" and should read -- 50-10000 sccm --.

Column 13,
Line 42, reads "and b)" and should read -- and (b) --.

Signed and Sealed this

Fifteenth Day of July, 2003

JAMES E. ROGAN
*Director of the United States Patent and Trademark Office*